United States Patent [19]

Watanabe et al.

[11] Patent Number: 5,331,294
[45] Date of Patent: Jul. 19, 1994

[54] OSCILLATION CIRCUIT INCLUDING A RING OSCILLATOR HAVING A CHANGEABLE NUMBER OF INVERTER CIRCUITS

[75] Inventors: Takamoto Watanabe, Nagoya; Yoshinori Ohtsuka; Tadashi Hattori, both of Okazaki, all of Japan

[73] Assignee: Nippondenso Co., Ltd., Kariya, Japan

[21] Appl. No.: 956,955

[22] Filed: Oct. 2, 1992

[30] Foreign Application Priority Data

Oct. 4, 1991 [JP] Japan ................... 3-258039

[51] Int. Cl.⁵ .................. H03B 5/00; H03L 7/099
[52] U.S. Cl. ..................... 331/57; 331/1 A;
331/25; 331/34; 331/179
[58] Field of Search ........... 331/55, 57, 59, 111,
331/143, 153, 172, 179, 1 A, 18, 25, 34

[56] References Cited

U.S. PATENT DOCUMENTS

| 4,978,927 | 12/1990 | Hausman et al. | 331/57 |
| 5,045,811 | 9/1991 | Lewis | 331/57 X |
| 5,128,624 | 7/1992 | Hoshino et al. | 328/133 |

FOREIGN PATENT DOCUMENTS

| 60-250712 | 12/1985 | Japan . |
| 61-125218 | 6/1986 | Japan . |
| 01117514 | 5/1989 | Japan . |
| 2296410 | 12/1990 | Japan . |

Primary Examiner—David Mis
Attorney, Agent, or Firm—Cushman, Darby & Cushman

[57] ABSTRACT

A digitally controllable oscillator is provided with a variable-frequency ring oscillator comprising an odd number of inverting circuits connected to each other in a ring. The frequency of the output signal of the ring oscillator is determined by a digital input signal specifying the frequency of the output signal of the ring oscillator. The number of times of circulation of a pulse signal through the ring oscillator is counted. A pulse generator generates a pulse signal upon the coincidence of the counted number of times of circulation of the pulse signal through the ring oscillator with a number corresponding to the digital input signal. A series of these operations is repeated to make the pulse generator generate pulse signals successively at a period corresponding to the digital input signal.

11 Claims, 10 Drawing Sheets

5,331,294

OSCILLATION CIRCUIT INCLUDING A RING OSCILLATOR HAVING A CHANGEABLE NUMBER OF INVERTER CIRCUITS

BACKGROUND OF THE INVENTION

1. Field of the Invention

The present invention relates to a variable-frequency oscillation circuit whose output frequency can be varied by digital control, and a digitally controlled oscillator employing the variable-frequency oscillation circuit to control the period of a pulse signal.

2. Description of the Prior Art

A voltage-controlled oscillator (hereinafter abbreviated as "VCO") whose output frequency can be controlled by an analog control voltage has been used as a variable-frequency oscillator for a phase-locked loop (hereinafter abbreviated as "PLL") in communications equipment or motor controllers.

The center frequency of the VCO is dependent on a specific resistor and a specific capacitor. Therefore, the resistor and the capacitor must be changed when the center frequency needs to be, and the resistor and the capacitor need fine adjustment to determine the center frequency accurately.

A digital control system employing a microcomputer or the like has been used for advanced control; however, a digital control system incorporating a conventional VCO needs an analog/digital converter to translate digital control signals provided by the microcomputer into proportional analog signals, thereby requiring a complex circuit configuration and increasing the cost of the digital control system.

A known variable-frequency oscillation circuit capable of directly controlling its output frequency by a digital control signal divides the internal clock of a microcomputer or the like for triggering. However, since the conventional variable-frequency oscillation circuit capable of being controlled by digital control signals divides a clock signal to provide an output signal of a desired frequency, the frequency of the output signal is a low frequency on the order of 100 kHz or below. Accordingly, it has been impossible to apply the conventional variable-frequency oscillation circuit to communications equipment and motor controllers which deal with signals of frequencies in the range of several hundreds of KHz to several tens of MHz.

SUMMARY OF THE INVENTION

It is a first object of the present invention to provide a variable-frequency oscillator having a novel circuit configuration whose output frequency can be directly controlled by digital control signals.

A second object of the present invention is to enable digital control of the output frequency of a variable-frequency oscillator in a wide frequency range from a low frequency to a high frequency.

To achieve the above objects, the present invention employs a pulse circulating circuit formed by connecting an odd number of inverters in a ring to generate an output signal by circulating a pulse signal. It is a feature of the present invention that the output frequency of the pulse circulating circuit is changed by increasing or decreasing the number of the inverters by an even number at a time.

It is another feature of the present invention that the number of times of circulation of a pulse is regulated to control the output frequency.

DETAILED DESCRIPTION OF THE PREFERRED EMBODIMENTS

Figure 1:
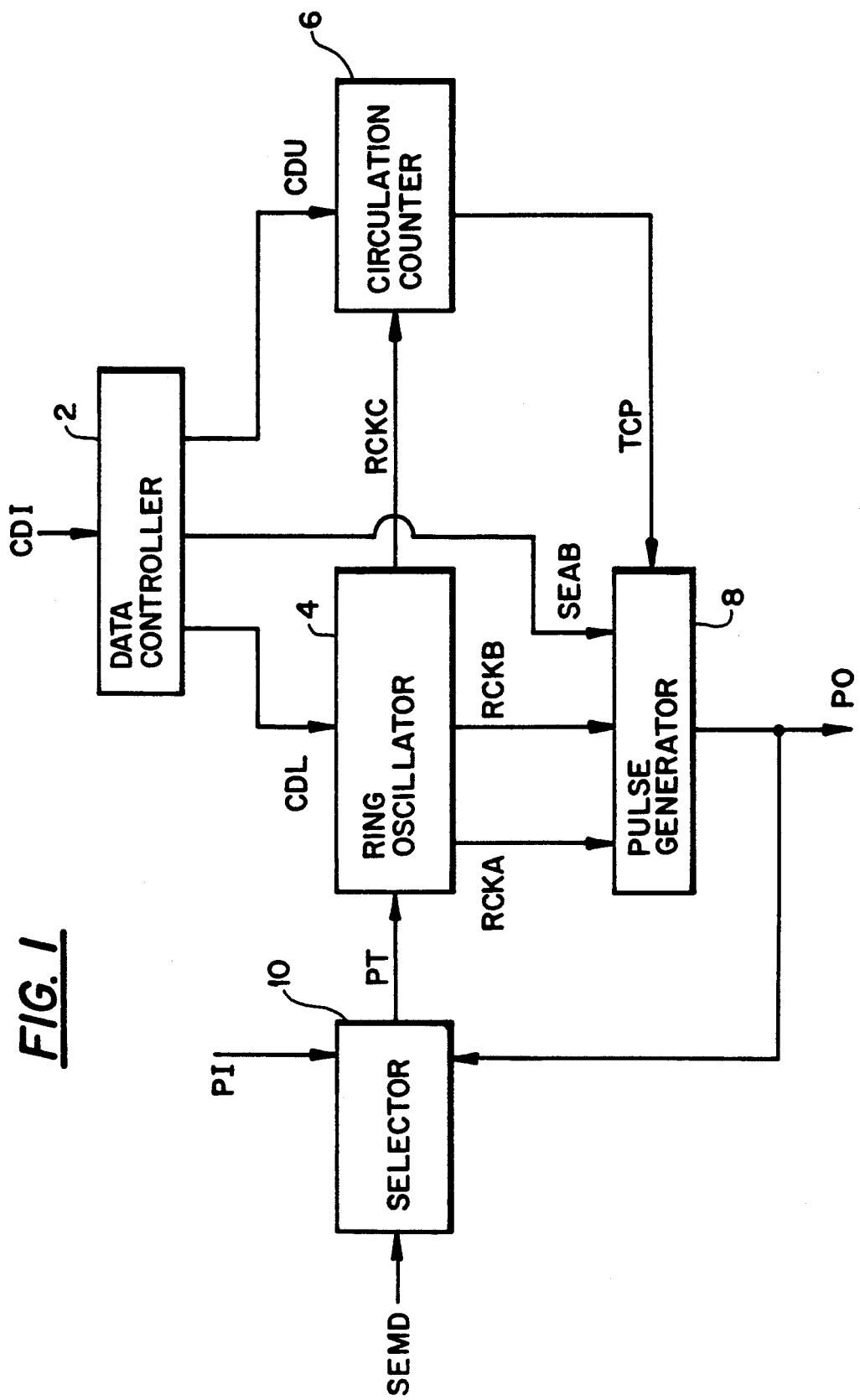
FIG. 1 is a block diagram of a digitally controlled oscillator embodying the present invention.

Referring to FIG. 1, a digitally controlled oscillator comprises a data controller 2, a variable-frequency oscillator (hereinafter referred to simply as "ring oscillator") 4, a circulation counter 6, a pulse generator 8 and a selector 10.

The data controller 2 receives a 16-bit digital data word CDI representing a desired period of the output pulse signal of the digitally controlled oscillator and gives control data CDU (11 bits), CDL (5 bits) and SEAB (1 bit) to the circulation counter 6, the ring oscillator 4 and the pulse generator 8, respectively. The ring oscillator 4 circulates the pulse signal at a period corresponding to the 5-bit control data CDL. The circulation counter 6 receives a circulation signal RCKC from the ring oscillator 4 to count the number of times of circulation of the pulse signal within the ring oscillator 4, and then provides a detection signal TCP when the count of the number of times of circulation of the pulse signal coincides with the control data CDU given thereto from the data controller 2. When the circulation counter 6 provides the detection signal TCP, the pulse generator 8 selects either a circulation signal RCKA provided by the ring oscillator 4 or a circulation signal RCKB provided by the ring oscillator 4 according to the 1-bit control signal SEAB given thereto from the data controller 2 and generates a pulse PO of a predetermined pulse width upon the inversion of the circulation signal RCKA or RCKB. The selector 10 receives a selection signal SEMD specifying a mode of operation of the digitally controlled oscillator, i.e., a signal requiring the digitally controlled oscillator to operate as an oscillator or as a delayed pulse generator. When the digitally controlled oscillator is required to operate as an oscillator, the selector 10 applies control pulses PT to the ring oscillator 4 in synchronism with the output pulse PO provided by the pulse generator to start and stop the circulating operation of the ring oscillator 4. When the digitally controlled oscillator is required to operate as a delayed pulse generator, the selector 10 applies external reference pulses PI as the control pulses PT to the ring oscillator 4.

Figure 2A:
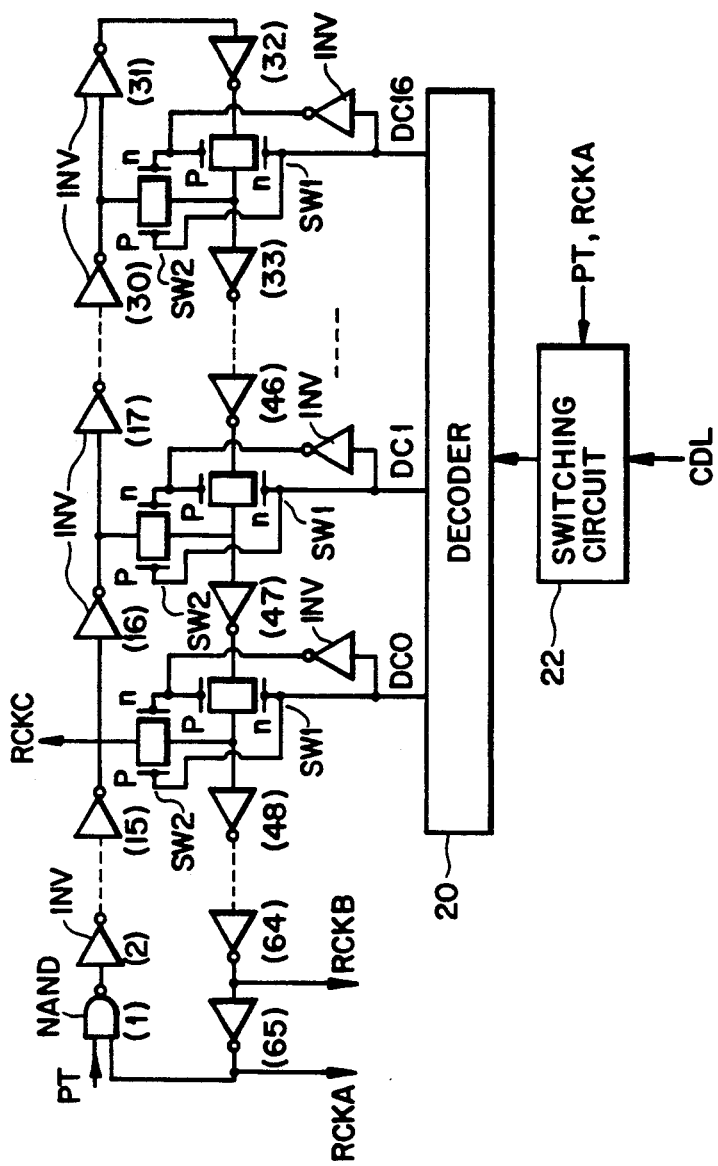
FIGS. 2A and 2B are views explaining the configuration and operation of a ring oscillator (4) embodying the present invention.

Referring to FIG. 2A, the ring oscillator 4 has an inversion circuit consisting of one NAND circuit and sixty-four inverters INV. The NAND circuit and the inverters INV are connected sequentially in a ring, that is, the output terminal of the NAND circuit is connected to the input terminal of the first inverter INV, the output terminal of the preceding inverter INV is connected to the input terminal of the succeeding inverter INV, and the output terminal of the last inverter INV is connected to one of the input terminal of the NAND circuit. The selector 10 applies the control pulses PT to the other input terminal of the NAND circuit.

A switching circuit SW1 consisting of an n-channel MOS transistor and a p-channel MOS transistor is connected to each of lines interconnecting the adjacent inverters INV from the inverter INV (32), i.e. the 32nd stage of the ring from the NAND circuit, i.e., the 1st stage (1), to the inverter INV (48), i.e., the 48th stage of the ring from the NAND circuit. The input terminals of the inverters INV (32) to (48) subsequent, respectively, to the switching circuits SW1 are connected through switching circuits SW2 to the output terminals of the inverter INV (30), i.e., the 30th stage, to the inverter INV (15), i.e., the 15th stage, respectively. Each of the switching circuits SW2, similarly to the switching circuits SW1, consists of an n-channel MOS transistor and a p-channel MOS transistor.

The pairs of switching circuits SW1 and SW2 connected respectively to the input terminals of the inverters INV (33) to INV (48) serve as stage number changing means for changing the number of stages including the NAND circuit and the inverters INV of the ring oscillator 4 in seventeen steps, i.e., steps between thirty-three stages and sixty-five stages. The switching circuits SW1 and SW2 are turned on or turned off according to switching signals DC0 to DC16 provided by a decoder 20 serving as a stage number control means.

The decoder 20 receives 5-bit control data CDL through a data switching circuit 22 from the data controller 2. The decoder 20 makes only the switching signal corresponding to input data LOW and makes the rest of the switching signals HIGH. For example, the decoder 20 makes only the switching signal DC0 LOW when the control data CDL is "00000" representing "0", makes only the switching signal DC1 LOW when the control data CDL is "00001" representing "1", makes only the switching signal DC15 LOW when the control data CDL is "01111" representing "15" and makes only the switching signal DC16 LOW when the control data CDL is "10000" representing "16". Each switching circuit SW1 is OFF when the corresponding switching signal DC is LOW and each switching circuit SW2 is ON when the corresponding switching signal DC is LOW.

A circulation signal RCKC that appears at the output terminal of the inverter INV (15), i.e., the inverter forming the 15th stage, which is not affected by the switching signals DC0 to DC16 provided by the decoder 20 and remains always functional among the sixty-four inverters INV, is applied to the circulation number counter 6. Circulation signals RCKA and RCKB that appear, respectively, at the output terminals of inverters INV (65) and INV (64), which are not affected by the switching signals DC0 to DC16 and remain always functional, are applied to the pulse generator 8.

Each of the switching signals DC0 to DC16 provided by the decoder 20 for the ON-OFF control of each of the pairs of the switching circuits SW1 and SW2 is applied directly to the n-channel MOS transistor of the switching circuit SW1 and to the p-channel MOS transistor of the switching circuit SW2, and is applied indirectly through the inverter INV to the p-channel MOS transistor of the switching circuit SW1 and to the n-channel MOS transistor of the switching circuit SW2.

Each of the switching circuits SW1 and SW2 consists of the p-channel MOS transistor and the n-channel MOS transistor so that the rise time and fall time of the pulse signal passing the switching circuits SW1 and SW2 are equal to each other.

The number of stages of the NAND circuit and the inverters INV is increased or decreased by two at a time in the range of thirty-three to sixty-five by the switching signals DC0 to DC16 provided by the decoder 20 so that the number of stages is always an odd number, for example, thirty-three, thirty-five, . . . or sixty-five. The output of the NAND circuit forming the first stage (1) goes HIGH regardless of the output of the inverter INV (65) forming the last stage when the control pulse PT provided by the selector 10 is LOW. The output of the NAND circuit is the inversion of the output of the last inverter INV (65) when the control pulse PT is HIGH.

The outputs of the even-numbered inverters INV, such as the inverter INV (2), go LOW and those of the odd-numbered inverters INV, such as the inverter INV (3), go HIGH when the control pulse PT provided by the selector 10 is LOW.

When the level of the control pulse PT provided by the selector 10 is changed from LOW to HIGH, the output of the NAND circuit goes LOW after a predetermined inversion time, the respective levels of the outputs of the inverters INV are inverted, for example, the level of the inverter INV (2) goes HIGH and the level of the inverter INV (3) goes LOW, after a predetermined inversion time, and the level of the output of the NAND circuit is inverted again after the level of the output of the last inverter INV (65) has become the same level as that of the output of the NAND circuit and thereby the levels of the outputs of the inverters INV are inverted sequentially. This operation is repeated.

Figure 2B:
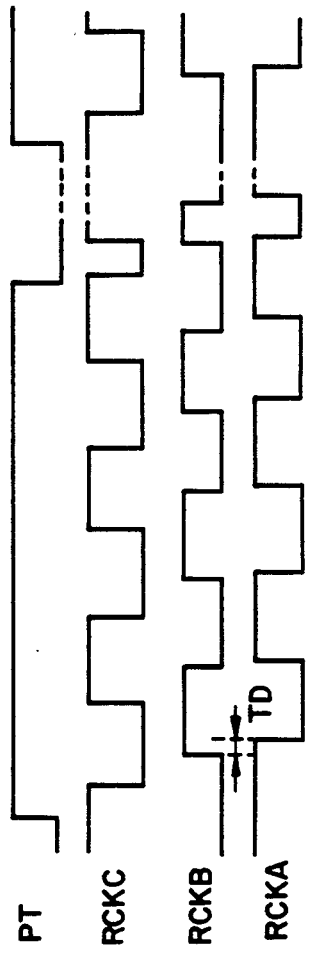

When the control pulse PT provided by the selector 10 is HIGH, the levels of the outputs of the NAND circuit and the inverters INV of the ring oscillator are inverted at a period x·TD, where x is the number of stages and TD is an inversion time required for the inversion of the output of each functional circuit. When the inversion time TD is 1 nsec and the number of stages is thirty-three, i.e., a minimum number of stages, the pulse signal circulating through the ring oscillator 4 is inverted every 33 nsec, whereby circulation signals RCKA, RCKB and RCKC as shown in FIG. 2B are generated.

Since the circulation signal RCKA is the output of the last inverter INV (65), the inversion of the circulation signal RCKA occurs after the inversion of the output of the NAND circuit with a delay time corresponding to one pulse time (x·TD). The circulation signal RCKB, i.e., the output of the inverter INV (64), is inverted after the inversion of the output of the NAND circuit with a delay time {(x-1)·TD}, which is shorter than the delay time x·TD by the inversion time TD.

The data switching circuit 22 through which the 5-bit control data CDL provided by the data controller 2 is given to the decoder 20 receives the control pulse PT and the circulation signal RCKA gives input data "00000" representing "0" to the decoder 20 at an instant when the level of the circulation signal RCKA is changed from the first time from HIGH to LOW after the control pulse PT has gone HIGH and the circulating operation of the ring oscillator 4 has been started, so that the switching signal DC0 is LOW and the circulation time is a minimum of 33·TD in the second and the following circulations of the pulse signal.

Thus, upon the reception of the control data CDL, the ring oscillator 4 circulates the pulse signal through the ring consisting of the stage 33, 35, . . . or 65 corresponding to the control data CDL for the first time and circulates the pulse signal through the ring of the minimum number thirty-three of stages in the second and the following times.

The ring oscillator 4 gives the output RCKA of the last inverter INV (65) and the output RCKB of the inverter INV (64) to the pulse generator, because the minimum number of the inverters INV which can be determined by the switching signals DC0 to DC16 is two.

If only the output of the last inverter INV (65) is given as a circulation signal to the pulse generator 8, the time resolution which can be measured by the circulating operation of the ring oscillator 4 is equal to an inversion time 2·TD for the two inverters INV. Therefore, the ring oscillator 4 is designed so that the circulation signals can be provided by the last inverter INV (65) and the inverter INV (64) precedent to the last inverter INV (65) to enhance the time resolution which can be measured by the circulating operation of the ring oscillator 4 to the inversion time TD.

Figure 3:
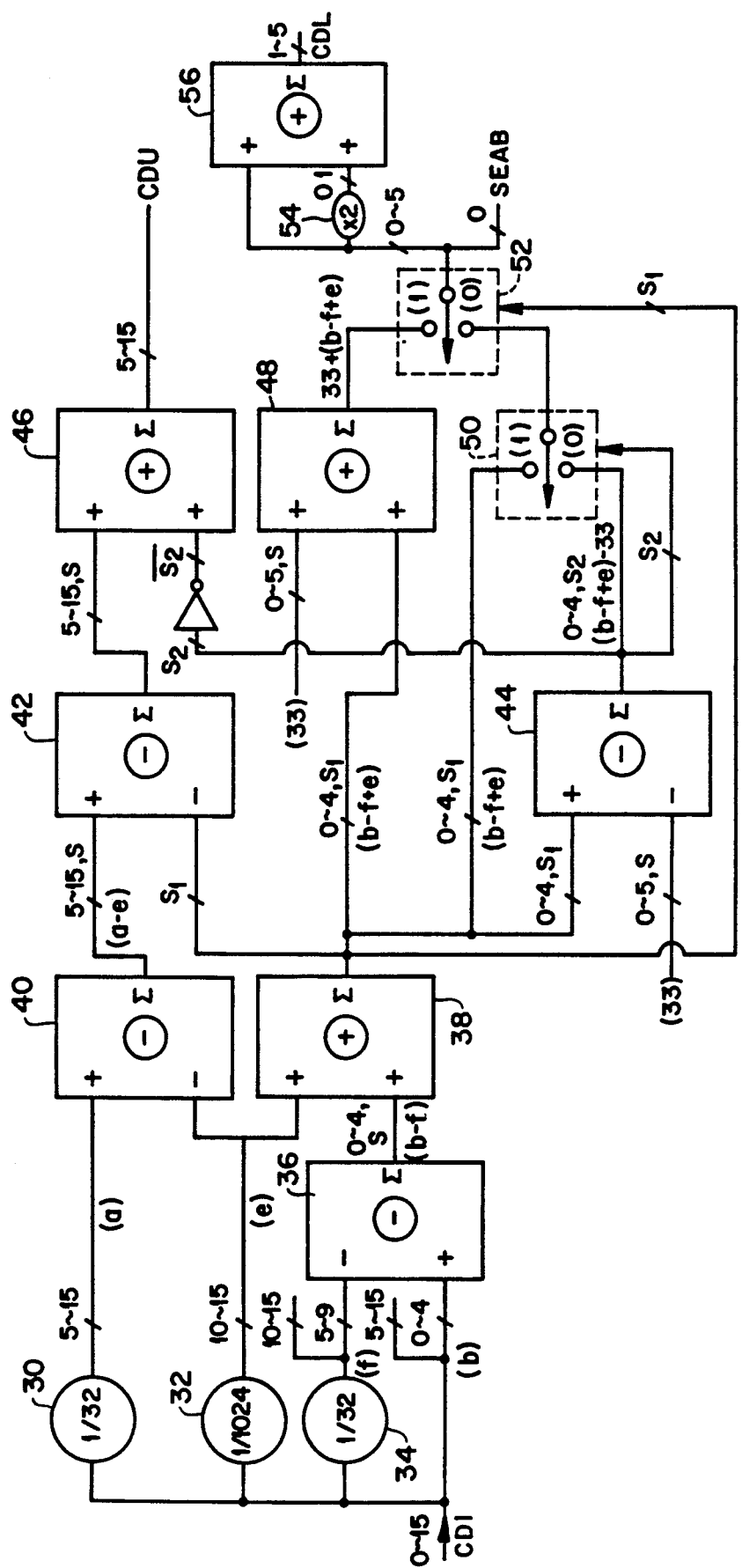
FIG. 3 is a diagram of the logic circuit of a data control unit (2) embodying the present invention.

Referring to FIG. 3, the data controller 2 comprises dividers 30, 32 and 34, a subtracter 36, adder 38, subtracters 40, 42 and 44, adders 46 and 48, selecting circuits 50 and 52, a multiplier 54 and an adder 56.

The divider 30 divides 16-bit (bits 0 to 15) digital data CDI by 32 to generate 11-bit (bits 5 to 15) digital data a. The divider 32 divides the digital data CDI by 1024 to generate 6-bit (bits 10 to 15) digital data e. The divider 34 divides the digital data CDI by 32 to generate digital data f of the lower five bits (bits 5 to 9). The subtracter 36 subtracts the 5-bit (bits 5 to 9) digital data f obtained by the divider 34 from digital data b of the lower five bits (bits 0 to 4) of the digital data CDI to generate 6-bit (bits 0 to 4, S) digital data b-f including sign data S (positive: 0, negative: 1). The adder 38 adds the digital data b-f and the digital data e obtained by the divider 32 to generate 6-bit (0 to 4, S2) digital data b-f+e including sign data S1 (positive: 0, negative: 1). The subtracter 40 subtracts the digital data e obtained by the divider 32 from the digital data a obtained by the divider 30 to generate 12-bit (5 to 15, S) digital data a-e including sign data S (positive: 0, negative: 1). The subtracter 42 subtracts the sign data S1 (0 or 1) of the digital data b-f+e obtained by the adder 38 from the digital data a-e obtained by the subtracter 40 to generate 12-bit (5 to 12, S) digital data a-e or a-e-1 including the sign data S. The subtracter 44 subtracts 7-bit (0 to 5, S ) digital data representing a predetermined value of 33 from the digital data b-f+e to generate 6-bit (0 to 4, S2) digital data b-f+e-33 including sign data S2 (positive: 0, negative: 1). The adder 46 adds the digital data a-e or a-e-1 obtained by the subtracter 42 and the inversion (1 or 0) of the sign data S2 (0 or 1) of the digital data b-f+e-33 to generate 11-bit (5 to 15) control data CDU. The adder 48 adds 7-bit (0 to 5, S) digital data representing a predetermined value of 33 and the digital data b-f+e obtained by the adder 38 to generate 6-bit (0 to 5) digital data 33+b-f+e. The selecting circuit 50 receives the sign data S2 of the digital data b-f+e-33 obtained by the subtracter 44, selects the digital data b-f+e-33 obtained by the subtracter 44 when the digital data S2 is "0", i.e., the sign of the digital data b-f+e-33 is positive, and selects the digital data b-f+e obtained by the adder 38 when the sign data S2 is "1", i.e., the sign of the digital data b-f+e-33 is negative. The selecting circuit 52 receives the sign data S1 of the digital data b-f+e obtained by the adder 38, selects the digital data b-f+e-33 or b-f+e selected by the selecting circuit 50 when the sign data S1 is "0", i.e., the digital data b-f+e is positive, and selects the digital data 33+b-f+e obtained by the adders 48 when the sign data S1 is "1", i.e., the digital data b-f+e is negative, provides 6-bit (0 to 5) selection data and the least significant bit (0) of the selection data as control data SEAB. The multiplier 54 multiplies the 6-bit (0 to 5) data provided by the selecting circuit 52 by two. The adder 56 adds the lower two bits (0, 1) of the digital data provided by the multiplier 54 and the 6-bit (0 to 5) data provided by the selecting circuit 52, and provides the five bits (1 to 5), i.e., bits from the lower second bit to the lower sixth bit as control data CDL.

The data controller 2 converts the digital data CDI into a digital signal of 33-positional notation corresponding to the minimum number 33 of stages of the NAND circuit and the inverters INV of the ring oscillator 4 to determine the control data CDU representing the number of times of circulation of the pulse signal in the ring oscillator 4, and converts the remainder of the conversion of the digital data CDI into the digital signal of 33-positional notation into the control data CDL representing the number of the functional inverters INV for the first circulation of the pulse signal and the control data SEAB specifying a position from which the circulation signal is taken by the pulse generator 8.

Since the digital data CDI is a 16-bit digital data, $$CDI = 32 \times (a+b) \tag{1}$$

where a represents upper eleven bits, and b represents lower five bits, and $$CDI = 1024 \times e + 32 \times (f+b) \tag{2}$$

where e represents the upper six bits among the upper eleven bits and f represents the lower five bits among the upper eleven bits. Accordingly, the digital data CDI can be expressed by data of 33-positional notation:

$$CDI = 33 \times [a + (b - a)] \quad (3)$$
$$= 33 \times a + \{b - (32 \times e + f)\}$$
$$= 33 \times a + \{b - (33 \times e - e + f)\}$$
$$= 33 \, V(a - e) + (b - f + 3)$$

where (a-e) represents the number of times of circulation of the pulse signal in the ring oscillator 4 having thirty-three stages, and (b-f+e) is the remainder.

If $0 < b-f+e < 32$ in the expression (3), the least significant bit of the 6-bit digital data is omitted when "0" or raised and "1" is added to the upper five bits when "1" to obtain the 5-bit control data CDL for controlling the decoder 20 to generate the switching signals DC0 to DC16 and to obtain the control data SEAB by the least significant bit. However, when $b-f+e < 0$ or $32 < b-f+e$ in the expression (3), which occurs in some cases, the values a-e and b-f+e cannot be used as control data as they stand.

Accordingly, the data controller 2 is formed by a logic circuit as shown in FIG. 3 to generate the control data CDU, CDL and SEAB according to rules shown in the following table.

| Fraction 1 | CDU | Fraction 2 (CDL, SEAB) |
| --- | --- | --- |
| 0 < b−f+e < 32 | a−e | b−f+e |
| b−f+e < 0 | a−e−1 | b−f+e+33 |
| 32 < b−f+e | a−e+1 | b−f+e−33 |

The control data SEAB is "1" for selecting the circulation signal RCKB when the fraction 2 is an odd number or "0" for selecting the circulation signal RCKA when the fraction 2 is an even number.

When a 16-bit digital CDI of "1110110001100001" representing 60513 is applied to the data controller 2, a=1891, b=1, e=59 and f=3, a-e=1832 and b-f+e=57. Therefore, the control data CDU=1833 (=1832+1), CDL=12 (=(57-3)/2)and SEAB=1.

Figure 4A:
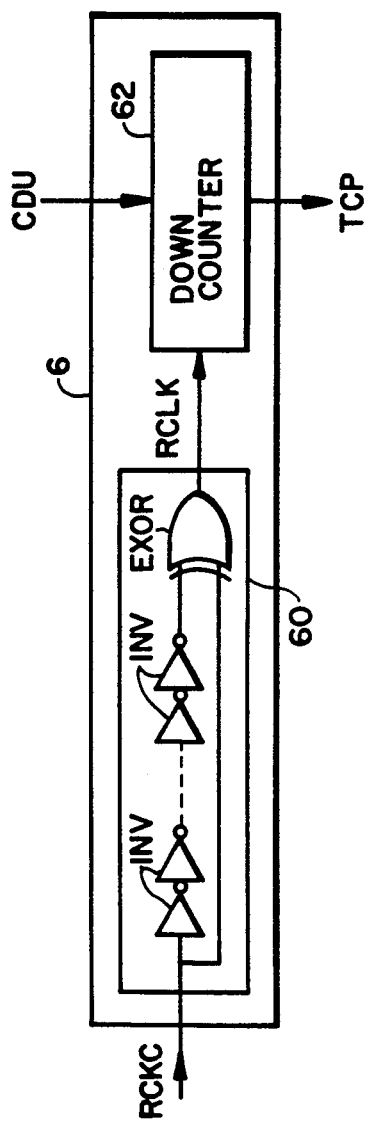
FIGS. 4A and 4B are views explaining the circuit configuration and operation of a circulation counter (6) embodying the present invention.

Referring to FIG. 4A, the circulation counter which counts the number of times of circulation of a pulse signal in the ring oscillator 4 on the basis of the circulation signal RCKC provided by the ring oscillator 4 comprises an inverting signal generating circuit 60 and a down counter 62.

The inverting signal generating circuit 60 generates a pulse signal RCLK every time the circulation signal RCKC is inverted. The down counter 62 is set for an initial count by the control data CDU provided by the data controller 2, counts down the initial count at every reception of the output pulse RCLK from the inverting signal generating circuit 60, and generates a detection signal TCP upon the decrease of the count to zero.

The inverting signal generating circuit 60 is provided with an exclusive-OR (hereinafter referred to as "EXOR") circuit. The circulation signal RCKC is applied directly to a first input terminal, i.e., one of the input terminals, of the EXOR circuit, and the circulation signal RCKC is applied through a delay circuit consisting of an even number of inverters INV to the a second input terminal, i.e., the other input terminal, of the EXOR circuit. Thus, the circulation signal RCKC is applied to the second input terminal of the EXOR circuit with a delay time dependent on the number of the inverters INV and their inverting time relative to the circulation signal RCKC applied directly to the first input terminal. Therefore, the level of the first input terminal of the EXOR circuit and that of the second input terminal of the EXOR circuit remain different from each other for a period corresponding to the delay time after the inversion of the circulation signal RCKC and the output signal of the EXOR circuit remains HIGH for the period.

Figure 4B:
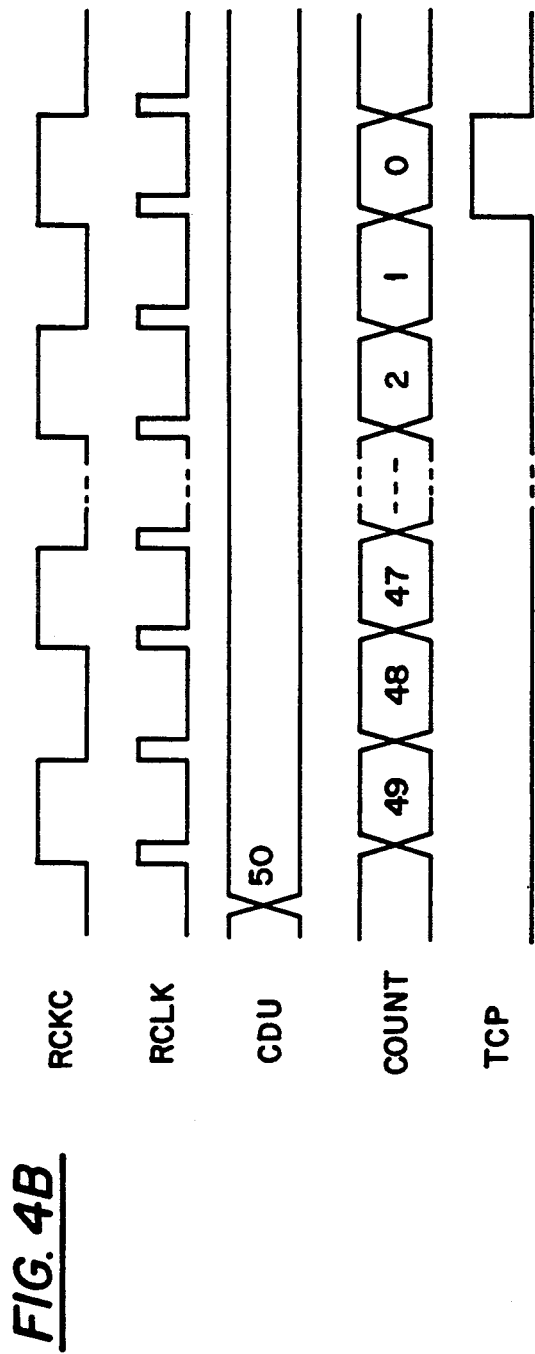

Referring to FIG. 4B, the down counter 62 of the circulation counter 6 is set for "50" when the control data CDU is "50". The count on the down counter is decremented by one every time the inversion signal generating circuit 60 generates the pulse signal RCLK. Upon the decrease of the count on the down counter 62 to zero, the detection signal TCP is provided. The down counter 62 is initialized when the control pulse provided by the selector 10 is LOW, i.e., when the circulating operation of the ring oscillator 4 is stopped.

Figure 5A:
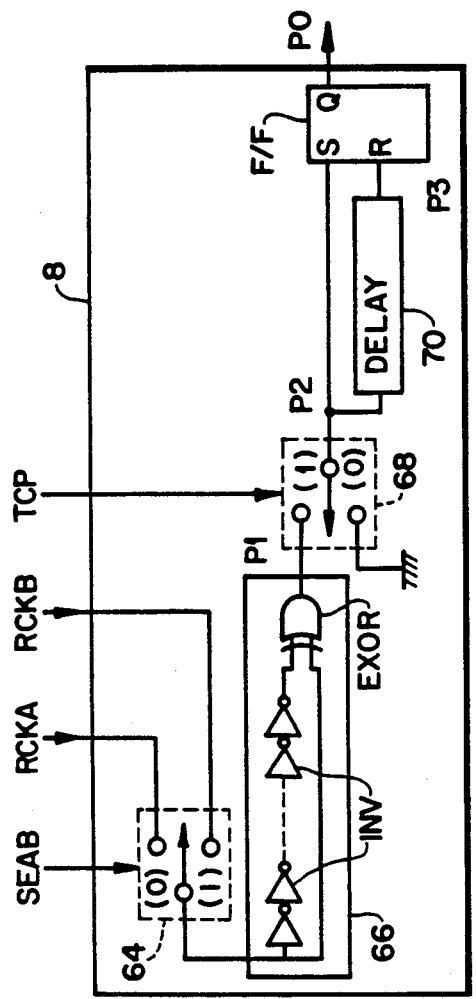
FIGS. 5A and 5B are views explaining the circuit configuration and operation of a pulse generator embodying the present invention.

Referring to FIG. 5A, the pulse generator 8 comprises selective switches 64 and 68, an inverting signal generating circuit 66, a delay line 70 and an RS flip-flop F/F.

The selective switch 64 selects either the circulation signal RCKA or the circulation signal RCKB provided by the ring oscillator 4 according to the control data SEAB provided by the data controller 2. The inverting signal generating circuit 66 generates a pulse signal P1 every time the circulation signal RCKA or RCKB applied thereto through the selective switch 64 is inverted. The selective switch 68 receives the detection signal TCP from the circulation counter 6, passes the pulse signal P1 received from the inverting signal generating circuit 66 as a pulse generation signal P2 when the detection signal TCP is HIGH, and intercepts the pulse signal P1 and grounds its output terminal when the detection signal TCP is LOW. The delay line 70 receives the pulse generation signal P2 through the selective switch 68 and provides a pulse stop signal P3 a predetermined time TDD after the reception of the pulse generation signal P2. The RS flip-flop F/F is set when the pulse generation signal P2 is applied thereto and is reset when the pulse stop signal P3 is applied thereto.

The selective switch 64 selects the circulation signal RCKB when the control data SEAB is "1" and selects the circulation signal RCKA when the control data SEAB is "0". The inverting signal generating circuit 66 comprises an even number of inverters INV and an EXOR circuit. The operation of the inverting signal generating circuit 66 is similar to that of the inverting signal generating circuit 60.

Figure 5B:
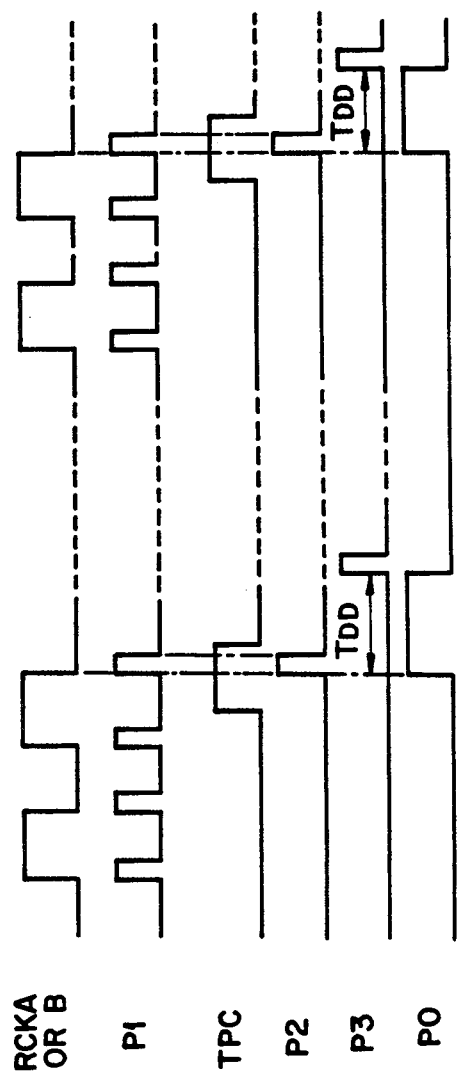

As shown in FIG. 5B, the RS flip-flop F/F is set by the pulse generation signal P2 at an instant when the circulation signal RCKA or RCKB applied through the selective switch 64 to the inverting signal generating circuit 66 is inverted while the detection signal TPC provided by the circulation counter 6 is HIGH and, after the delay time TDD determined by the delay line 70, the RS flip-flop F/F is reset. Thus, the output signal of the RS flip-flop F/F remains HIGH for the delay time TDD after the inversion of the circulation signal RCKA or RCKB that occurs upon the completion of circulation of the pulse signal by a number of times of circulation corresponding to the control data CDU in the ring oscillator 4. The HIGH portion of the output signal of the RS flip-flop F/F is the output pulse PO of the pulse generator 8.

Figure 6A:
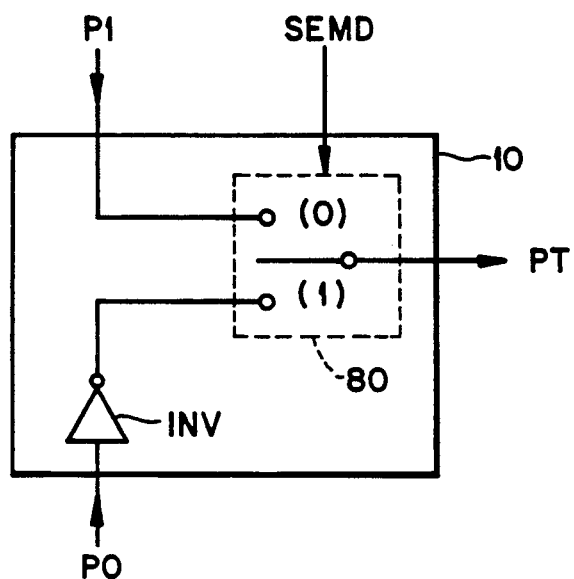
FIGS. 6A and 6B are views explaining the circuit configuration and operation of a selector (10) embodying the present invention.

Referring to FIG. 6A, the selector 10 comprises an inverter INV for inverting the output pulse PO of the pulse generator 8, and a selective switch 80 which selects the inverted output pulse PO obtained by inverting the output pulse PO of the pulse generator 8 by the inverter INV when an external selection signal SEMD is HIGH and selects the external reference pulse PI as a control pulse PT when the external selection signal SEMD is LOW.

Figure 6B:
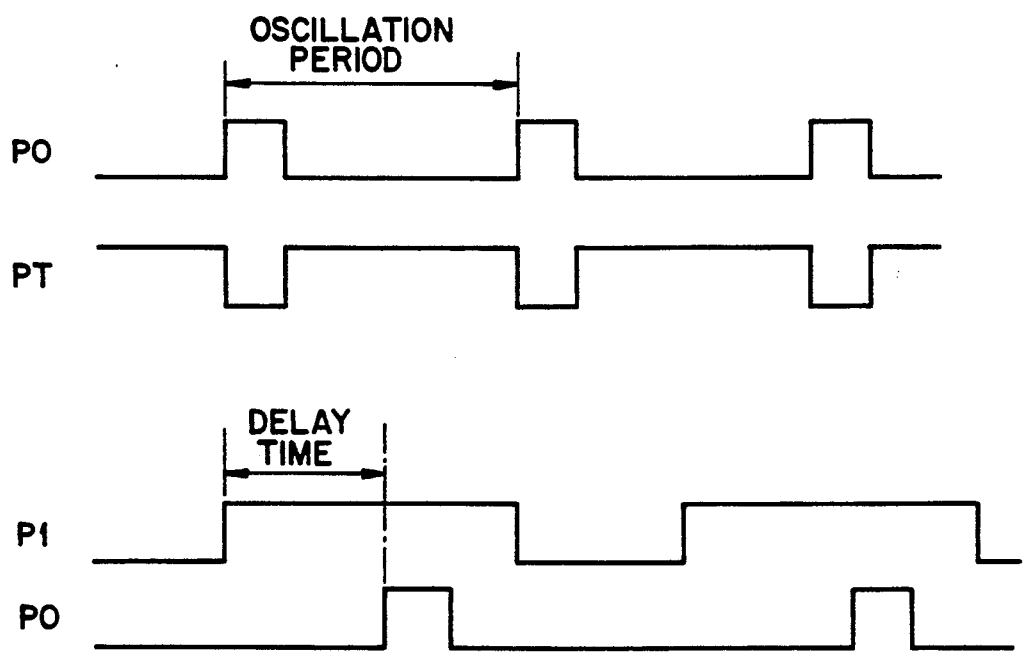

As shown in FIG. 6B, the selector 10 stops the circulating operation of the ring oscillator 4 during the duration of the output pulse PO generated by the pulse generator 8 when the selection signal SEMD is HIGH, and provides the control pulse PT to enable the circulating operation of the ring oscillator 4 while the pulse generator 8 does not generate the output pulse PO. The period at which the digitally controlled oscillator generates the output pulses PO, i.e., the period of oscillation, can be controlled by the control pulse PT.

Since the selector 10 selects the reference pulse PI as the control pulse PT when the selection signal SEMD is LOW, the digitally controlled oscillator is able to function as a delayed pulse generator capable of controlling the delay time, i.e., a time period between the reception of the reference pulse PI and the generation of the output pulse PO of the pulse generator 8.

Figure 7:
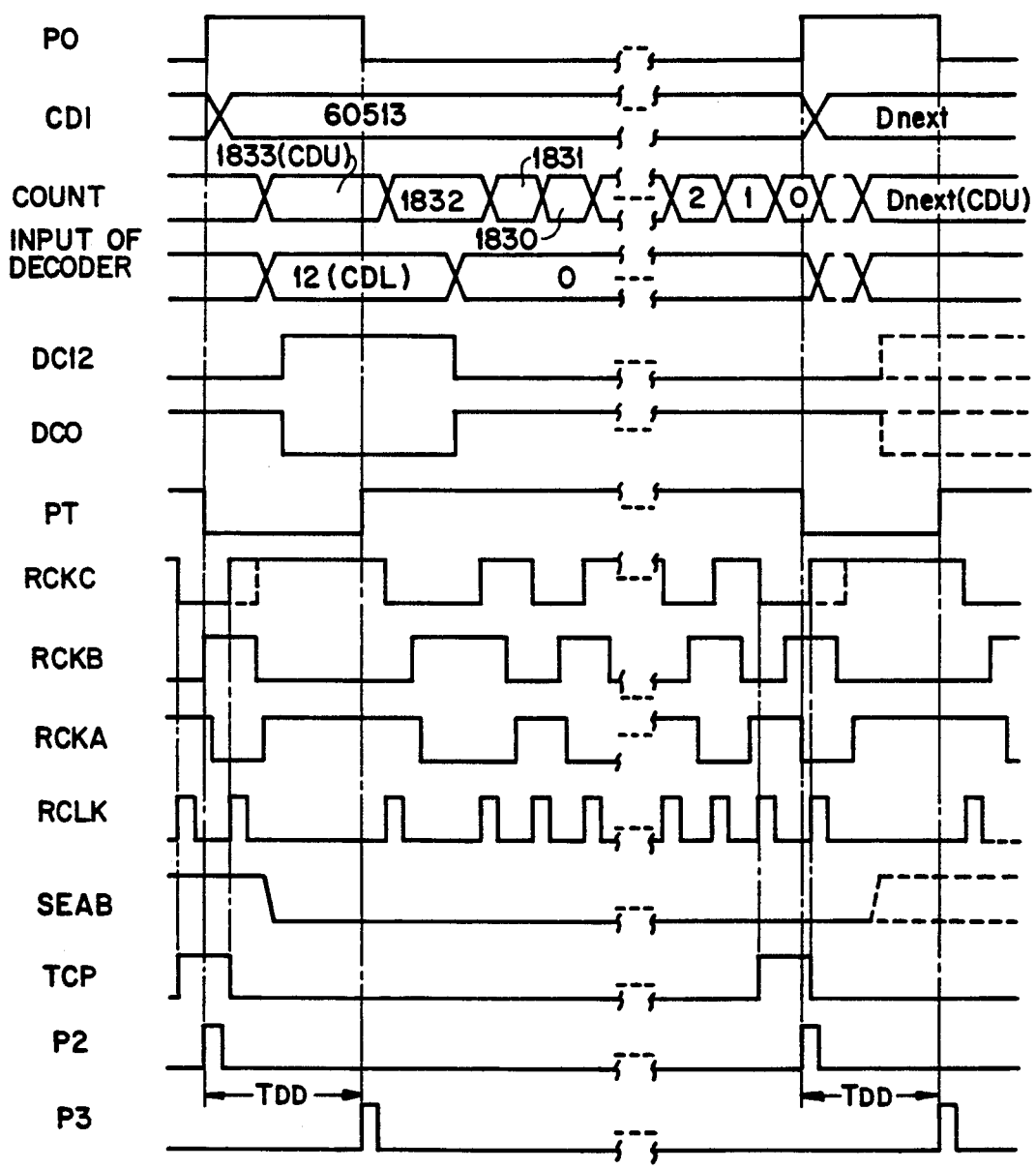
FIG. 7 is a time chart explaining the operation of the digitally controlled oscillator embodying the present invention.

As shown in FIG. 7, in the digitally controlled oscillator in this embodiment, the ring oscillator 4 stops the circulating operation and the circulation counter 6 is initialized by the control data CDU provided by the data controller 2 while the control pulse PT is LOW. Upon the inversion of the control pulse PT from LOW to HIGH, the ring oscillator 4 starts the circulating operation to circulate a pulse signal for the first circulation through the inverting circuit of 33+? stages (?=0, 2, 4, ... or 32), i.e., the NAND circuit and the inverters INV. The number 33+? of stages corresponds to a number specified by the control data CDL provided by the data controller 2. The pulse signal is circulated through the inverting circuit of 33 stages, which is a minimum number of stages, for the second and the following circulation.

The count on the circulation counter 6 is decremented by one every time the circulation signal RCKC provided by the ring oscillator 4 is applied to the circulation counter 6. Upon the decrease of the count on the circulation counter 6 to zero, that is, after the pulse signal has circulated in the ring oscillator 4 by a number of times of circulation specified by the control data CDU, the pulse generator 8 receives either the circulation signal RCKA or RCKB provided by the ring oscillator 4 according to the control data SARB provided by the data controller 2 and generates the output pulse PO for the predetermined time TDD.

Accordingly, the time interval between the generation of two successive output pulses PO of the pulse generator 8 can be controlled repeatedly controlled by the control data CDU, CDL and SEAB generated by the data controller 2 according to the digital data CDI by applying the selection signal SEMD of HIGH to the selector 10 to make the selector 10 select the control pulse PT in synchronism with the output pulse PO, so that the digitally controlled oscillator is able to function as an oscillator the period of oscillation of which is digitally controllable. The time interval between the reception of the reference pulse and the generation of the output pulse PO of the pulse generator 8 can be controlled by the control data CDU, CDL and SEAB generated according to the digital data CDI provided by the data controller 2 when the selection signal SEMD of LOW is applied to the selector 10 to make the selector 10 provides the reference pulse PI as the control pulse PT, so that the digitally controllable oscillator is able to function as a delayed pulse generator the delay time of which is digitally controllable.

The pulse width of the output pulse PO of the pulse generator 8, i.e., the delay time TDD determined by the delay line 70, is not shorter than a time required for the pulse signal to circulate once, i.e., a time obtained by multiplying the inverting time TD required for the inverting operation of one stage by the number of stages of the NAND circuit and the inverters INV forming the ring oscillator 4 (33×TD, in this embodiment), when the output pulse PO is generated, because the circulating operation of the ring oscillator 4 is completed after the control pulse PT provided by the selector 10 has become LOW when both the output of the last inverter INV (65) of the ring oscillator 4 and the output of the NAND circuit becomes HIGH, and hence the pulse signal must be circulated once through the NAND circuit forming the first stage through the last inverter INV (65) forming the last stage.

Thus, the operating mode of the digitally controlled oscillator of the present invention can be changed by the external selection signal SEMD between an operating mode in which the digitally controlled oscillator operates as an oscillator capable of digitally controlling the period at which the output pulses PO are generated and in an operating mode in which the digitally controlled oscillator operates as a delayed pulse generator capable of digitally controlling the delay time. The period at which the output pulses PO are generated or the delay time by which the output pulse PO is delayed can be determined by the external digital data CDI, and the period of the output pulses PO or the delay time can be changed stepwise by a step corresponding to the time for the inversion of each inverter INV of the ring oscillator 4 at a time. The period at which the output pulses PO are generated can be varied in a wide range by varying the number of times of circulation of the pulse signal in the ring oscillator 4. Accordingly, the frequency of the output signal of the digitally controlled oscillator can be digitally controlled in a high resolution in a wide frequency range of several Hz to several tens of MHz.

In this embodiment, the period at which the output pulses PO are generated is controlled by controlling the number of stages of the NAND circuit and the inverters INV of the ring oscillator 4 for the first circulation of the pulse signal in the ring oscillator 4 and the number of the stages is reduced to the minimum number of stages, i.e., 33 stages, for the second and the following circulation of the pulse signal. However, the number of the stages may be controlled by any method provided that the method is capable of accurately measuring the time required for the circulation of the pulse signal in the ring oscillator 4. For example, the pulse signal may be circulated in the ring oscillator of the maximum number of stages, i.e., 65 stages, in the normal state and the number of stages may be controlled only once, or the number of the stages may be changed repeatedly according to predetermined conditions.

The frequency of the output pulses PO of the digitally controlled oscillator can be set by the external digital data CDI and the frequency is dependent on the circulation of the pulse signal in the ring oscillator 4. Therefore, the accurate control of the frequency according to the digital data CDI is impossible if the inverting time TD of the inverting circuits, i.e., the NOT-AND element and the inverters INV, varies.

Since the digitally controlled oscillator is capable of the digital control of the frequency of oscillation, the frequency of oscillation can be simply and surely corrected by comparing the frequency of the output pulses of the digitally controlled oscillator with a reference frequency of output pulses of a reference oscillator, such as a quartz oscillator, setting correction data on the basis of the result of the comparison, and applying the external digital data CDI to the data controller 2 after correcting the external digital data CDI by using the correction data. An example of a correction data calculating device for determining the correction data will be described hereinafter with reference to FIGS. 8A, 8B and 9.

Figure 8A:
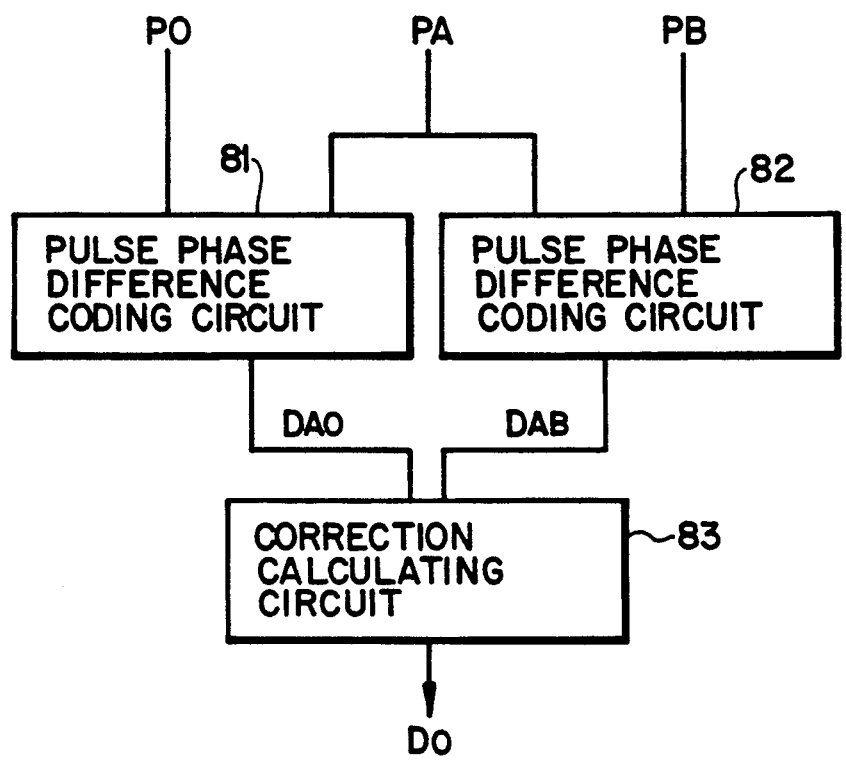
FIGS. 8A and 8B are views explaining the configuration and operation of a correction data calculating unit for providing correction data for correcting the period of oscillation of the output signal of the digitally controlled oscillator.

Referring to FIG. 8A, the correction data calculating device comprises a first pulse phase difference coding circuit 81 which codes the phase difference between input pulses, a second pulse phase difference coding circuit 82 which codes the phase difference between input pulses, and a correction calculating circuit 83 for calculating correction data D0 on the basis of coded data provided by the pulse phase difference coding circuits 81 and 82. The first pulse difference coding circuit 81 receives reference pulses PA generated by a reference oscillator, such as a quartz oscillator, and the output pulses PO of the digitally controlled oscillator. The second pulse phase difference coding circuit 82 receives the reference pulses PA and delayed pulses PB produced by delaying the reference pulses PA by a predetermined delay time. The output pulses PO of the digitally controlled oscillator applied to the first pulse phase difference coding circuit 81 are those which are generated by the digitally controlled oscillator when the digital data CDI specifies a frequency of oscillation equal to that of the reference pulses PA.

Figure 9:
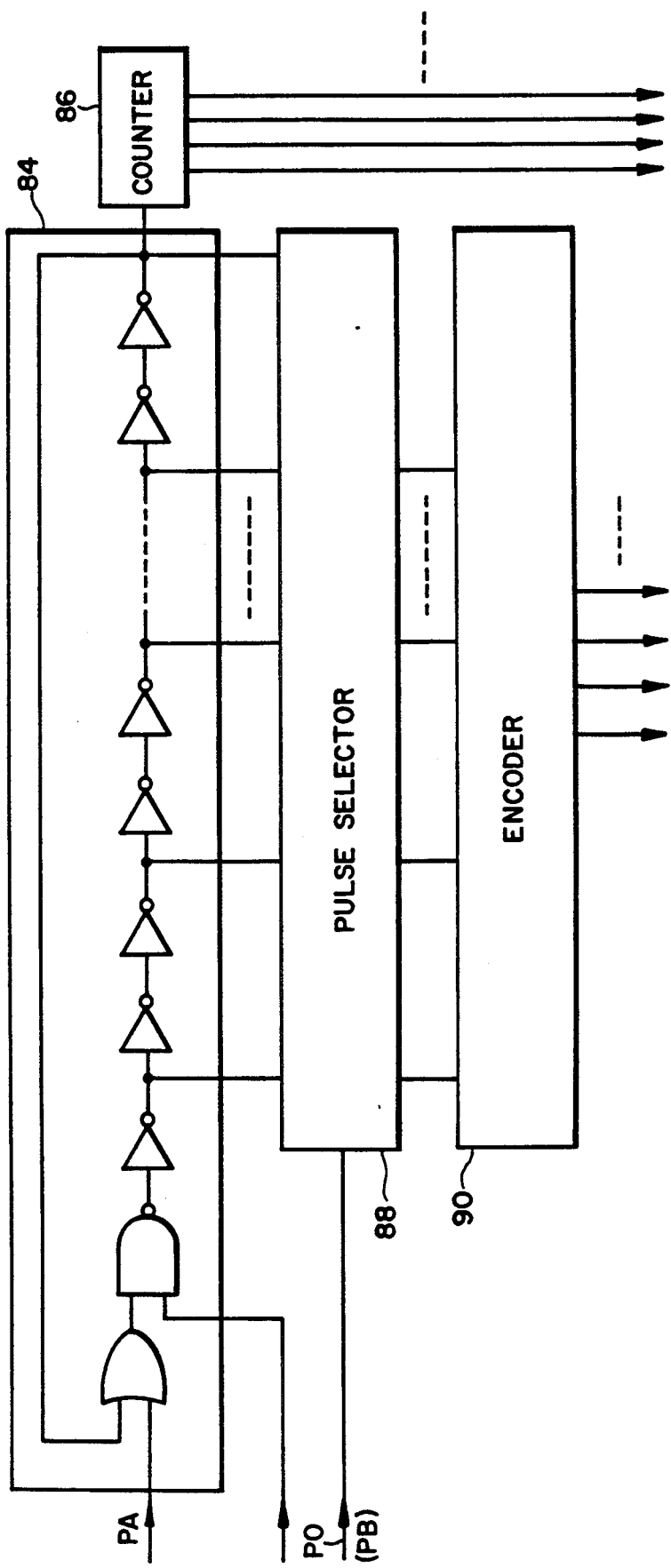
FIG. 9 is a circuit diagram of a pulse phase difference coding circuits (81, 82) included in the correction data calculating device.

As shown in FIG. 9, each of the pulse phase difference coding circuits 81 and 82 comprises a ring delayed pulse generator 84 consisting of an OR circuit; a NAND circuit and an even number of inverters INV, which are connected in series to form a ring; a counter 86; a pulse selector 88; and an encoder 90. These pulse phase difference coding circuits 81 and 82 are equivalent to those proposed in U.S. Pat. No. 5,128,624 assigned to the assignee of the present patent application.

The operation of the pulse phase difference coding circuits 81 and 82 will be described hereinafter.

The reference pulses PA is applied to the input terminal of the OR circuit of the ring delayed pulse generating circuit 84 of the pulse phase difference coding circuit 81 (82). Then, a plurality of delayed pulses appear at connection points in the ring delayed pulse generating circuit 84, respectively, and the delayed pulses are given to the pulse selector 88. Delay times by which the delayed pulses are delayed, respectively, are dependent on the number of the inverters INV before connection points where the delayed pulses appear. The pulse selector 88 receives another input pulse PO (PB). Upon the reception of the pulses PO (PB), the pulse selector 88 selects only the output from a stage of the ring delayed pulse generating circuit 84 reached by the reference pulse PA among the plurality of outputs of the ring delayed pulse generating circuit and gives a signal corresponding to the selected signal to the encoder 90. Then, the encoder 90 generates a binary digital signal corresponding to the input. Since the output terminal of the last inverter INV forming the last stage of the ring delayed pulse generating circuit 84 is connected to one of the input terminals of the OR circuit, the reference pulse PA is returned to the OR circuit with a delay time required for the reference pulse PA to pass through all the stages of the ring delayed pulse generating circuit 84. Thus, the reference pulse PA circulates through the ring delayed pulse generating circuit 84. The counter 86 is connected to the last inverter INV forming the last stage of the ring delayed pulse generating circuit 84 to count the number of times of circulation of the reference pulse PA. The counter 86 provides the counted number of times of circulation of the reference pulse PA as an upper bit of the output signal of the encoder 90.

Figure 8B:
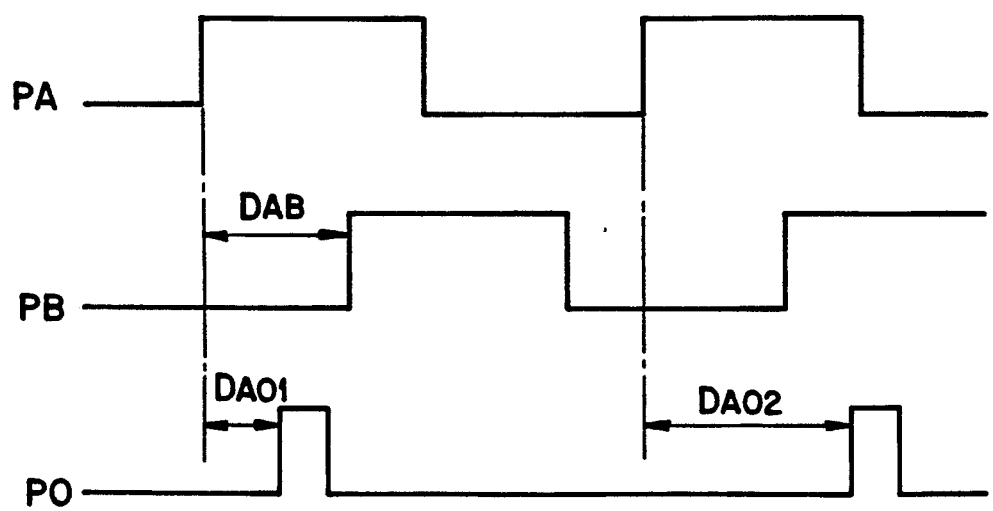

Consequently, as shown in FIG. 8B, a digital value DAO representing the phase difference between the pulses PA and PO or a digital value DAB representing the phase difference between the pulses PA and PB is obtained from the output signals of the pulse phase difference encoding circuits 81 and 82. The construction and function of the pulse phase difference coding circuits 81 and 82 are described in the aforementioned U.S. Pat. No. 5,128,624 and hence the description thereof will be omitted.

Thus, the first pulse phase difference coding circuit 81 provides the digital value DAO representing the phase difference between the output pulse PO of the digitally controlled oscillator and the reference pulse PA generated by the reference oscillator, and the second pulse phase difference coding circuit 82 provides the digital value DAO representing the phase difference between the reference pulses PA and PB. Since the digital value DAB represents the known input time difference between the reference pulses PA and PB, which are generated at the same frequencies, the digital value DAB can be used as reference time data. Since the digital value DAO represents merely the time difference between the leading edge of the reference pulse PA and that of the output pulse PO, it is impossible to determine the deviation of the period of the output pulses PO from that of the reference pulses PA directly from the digital value DAO.

The correction calculating circuit 83 calculates the difference between the two successive digital values DAO1 and DAO2 provided by the first pulse phase difference coding circuit 81 to obtain a digital value "DAO=DAO2−DAO1 corresponding to the time difference of the period of the output pulses PO relative to the reference pulses PA. If "DAO>0, the period of the output pulses PO is longer than that of the reference pulses PA. If "DAO<0, the period of the output pulses PO is shorter than that of the reference pulses PA.

Time difference data TAO=TAB·"DAO/DAB, where TAB is time represented by the digital value DAB, is calculated, the time difference data TAO and the reference period TA of the reference pulses PA are added to obtain the actual period TO (=TA+TAO) of oscillation of the output pulses PO, and then the reference period TA is divided by the period TO to determine correction data D0 (=TA/TO).

Suppose, for example, that the reference frequency of oscillation of the reference oscillator is 1 MHz (period=1000 nsec), the digital data CDI specifying a period of oscillation of 1000 nsec is applied to the digitally controlled oscillator and the actual period of oscillation is 800 nsec. Then, the time difference data TAO=−200 nsec, the period TO=800 nsec (TAO=−200 nsec and TA=1000 nsec), and the correction data D0=1.25=1000/800.

In this case, in operating the digitally controlled oscillator, correction digital data CCDI=D0-CDI obtained by correcting the digital data CDI by the correction data D0 is applied to the data controller 2 to make the digitally controlled oscillator generate the output pulses PO of a period corresponding to the digital data CDI.

Since the frequency of oscillation of the digitally controlled oscillator can be controlled even in a high frequency range of several tens of MHz by applying the digital data CDI to the data controller 2, the digitally controlled oscillator is applicable to high-frequency PLLs for communications equipment and motor controllers. For example, as shown in FIG. 10A, a high-frequency PLL that does not need any A/D converter or the like can be formed by using the digitally controlled oscillator as a variables-frequency oscillator 92, the pulse phase difference coding circuit of FIG. 9 as a phase comparator 94, and a known digital filter as a loop filter 96.

Figure 10A:
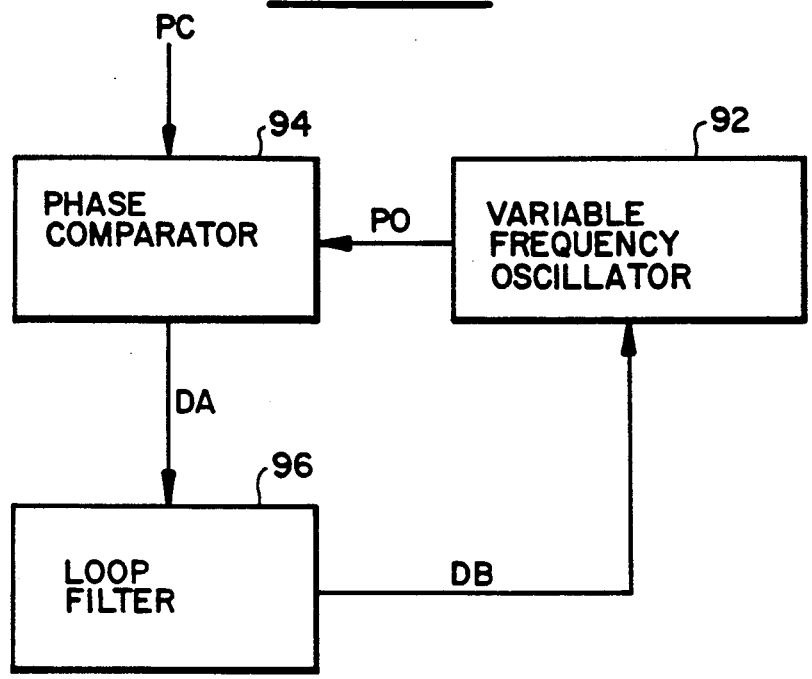
FIGS. 10A and 10B are views explaining the configuration and operation of a digital PLL employing the digitally controlled oscillator embodying the present invention.
Figure 10B:
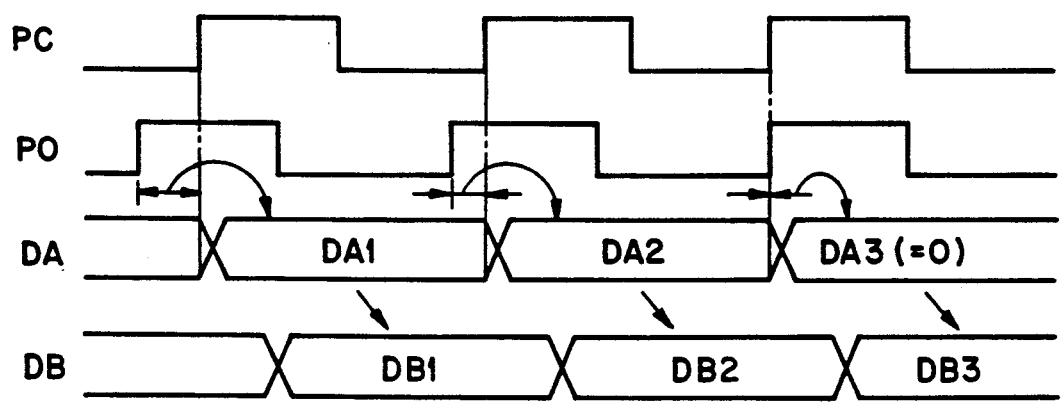

FIG. 10B is a time chart explaining the high-frequency digital PLL of FIG. 10A. The phase comparator 94 provides a digital value DA representing the phase difference between an output pulse PO and an external reference pulse PC, the loop filter 96 converts the digital value DA into a digital value DB and gives the digital value DB to the variable-frequency oscillator 92, so that the output pulse PO is controlled by the reference pulse PC. In this high-frequency PLL, variation of the inverting time of the inverters of the ring oscillator of the digitally controlled oscillator is corrected automatically by feedback control, the frequency control data need not be corrected.

The digitally controlled oscillator described herein uses the ring oscillator 4 shown in FIG. 2A to control the frequency of oscillation by using the number of times of circulation of the pulse signal. However, a desired frequency of oscillation may be determined by controlling the number of the functional inverters INV of the ring oscillator 4.

What is claimed is:

1. A variable-frequency oscillator whose output frequency is controllable, said oscillator comprising:
   a pulse circulating circuit comprising a plurality of inverting circuits directly electrically connected to each other in a ring shape for circulating a pulse signal therein;
   first means for changing direct electrical connections between inverting circuits directly electrically connected in said ring shape to include additional inverting circuits in said ring shape or exclude inverting circuits from said ring shape, thereby changing a period of circulation of said pulse signal;
   means for controlling said first changing means according to digital data inputted to said controlling means to change direct electrical connections between said inverting circuits directly electrically connected in said ring shape;
   means for counting the number of times of circulation of said pulse signal in said pulse circulating circuit and producing an output signal when the counted number equals to a predetermined number; and
   means for generating an oscillating signal on the basis of an output signal from a predetermined one of said inverting circuits in response to said output signal from said counting means, whereby the frequency of said oscillating signal is varied by said first and second changing means.

2. A variable-frequency oscillator according to claim 1, wherein one of said inverting circuits comprises a starting inverting circuit for starting a circulation of said pulse signal in said pulse circulating circuit.

3. A digitally controlled oscillator capable of varying a period of its output pulse signal, said digitally controlled oscillator comprising:
   a pulse circulating circuit comprising a plurality of inverting circuits directly electrically connected to each other in a ring shape for circulating a pulse signal therein;
   input means for receiving digital data representing the period of an output pulse signal;
   means for generating the output pulse signal upon the detection of the coincidence of the number of times of circulation of the pulse signal in the pulse circulating circuit with a number corresponding to said digital data;
   means for triggering the operation of said generating means in response to said output pulse signal from said generating means;
   means for changing direct electrical connections between inverting circuits directly electrically connected in said ring shape by a unit of an even number to include additional inverting circuits in said ring shape or exclude inverting circuits from said ring shape; and
   means for controlling said changing means according to said digital data to change direct electrical connections said inverting circuits directly electrically connected in said ring shape;
   wherein an oscillating signal is produced by the output pulse signals successively generated from said generating means.

4. A digitally controlled oscillator according to claim 3, wherein said generating means comprises:
   means for counting the number of times of circulation of said pulse signal and for generating a detection signal upon the detection of the coincidence of the counted number with the number corresponding to the digital data; and
   a pulse generator for generating said output pulse signal on the basis of said detection signal from said counting means.

5. A digitally controlled oscillator according to claim 3, wherein one of said inverting circuits comprises a starting inverting circuit for starting a circulation of said pulse signal in said pulse circulating circuit.

6. A digitally controlled oscillator according to claim 5, wherein said triggering means comprises means for starting the inverting action of said starting inverting circuit at the end of generation of said output pulse signal.

7. A digitally controlled oscillator capable of varying a period of its output pulse signal, said digitally controlled oscillator comprising:
   a pulse circulating circuit comprising a plurality of inverting circuits directly electrically connected to each other in a ring shape for circulating a pulse signal therein, one of said inverting circuits comprising a starting inverting circuit for starting a circulation of said pulse signal in said pulse circulating circuit;
   input means for receiving digital data representing the period of an output pulse signal;
   means for generating the output pulse signal upon the detection of the coincidence of the number of times of circulation of the pulse signal in the pulse circulating circuit with a number corresponding to said digital data;

means for triggering the operation of said generating means in response to said output pulse signal from said generating means, said triggering means comprising means for starting the inverting action of said starting inverting circuit at the end of generation of said output pulse signal;

means for changing direct electrical connections between inverting circuits directly electrically connected in said ring shape by a unit of an even number to include additional inverting circuits in said ring shape or exclude inverting circuits from said ring shape;

means for controlling said changing means according to said digital data to change direct electrical connections between said inverting circuits directly electrically connected in said ring shape; and means for setting a pulse width of said output pulse signal for a time longer than a time required for said pulse signal to circulate once through said pulse circulating circuit;

wherein an oscillating signal is produced by the output pulse signals successively generated from said generating means.

8. A digitally controlled oscillator capable of varying a period of its output pulse signal, said digitally controlled oscillator comprising:

a pulse circulating circuit comprising a plurality of inverting circuits directly electrically connected to each other in a ring shape for circulating a pulse signal therein;

input means for receiving digital data representing the period of an output pulse signal;

means for generating the output pulse signal upon the detection of the coincidence of the number of times of circulation of the pulse signal in the pulse circulating circuit with a number corresponding to said digital data;

means for triggering the operation of said generating means in response to said output pulse signal from said generating means;

means for changing direct electrical connections between inverting circuits directly electrically connected in said ring shape by a unit of an even number to include additional inverting circuits in said ring shape or exclude inverting circuits from said ring shape;

means for controlling said changing means according to said digital data to change direct electrical connections between said inverting circuits directly electrically connected in said ring shape;

means for generating a reference oscillating signal; and means for correcting said output pulse signal of said generating means on the basis of the deviation of the period of said output pulse signal from that of said reference oscillating signal;

wherein an oscillating signal is produced by the output pulse signals successively generated from said generating means.

9. A digitally controlled oscillator according to claim 8, wherein said detecting means comprises means for correcting the digital data received by said input means.

10. A digitally controlled oscillator capable of varying a period of its output pulse signal, said digitally controlled oscillator comprising:

a pulse circulating circuit comprising a plurality of inverting circuits directly electrically connected to each other in a ring shape for circulating a pulse signal therein;

input means for receiving digital data representing the period of an output pulse signal;

means for generating the output pulse signal upon the detection of the coincidence of the number of times of circulation of the pulse signal in the pulse circulating circuit with a number corresponding to said digital data;

means for triggering the operation of said generating means in response to said output pulse signal from said generating means;

means for changing direct electrical connections between inverting circuits directly electrically connected in said ring shape by a unit of an even number to include additional inverting circuits in said ring shape or exclude inverting circuits from said ring shape;

means for controlling said changing means according to said digital data to change direct electrical connections between said inverting circuits directly electrically connected in said ring shape; and means for comparing the phase of said output signal with that of a reference pulse signal and for adjusting the phase of said output pulse signal on the bases of the result of comparison;

wherein an oscillating signal is produced by the output pulse signals successively generated from said generating means.

11. A digitally controlled oscillator capable of varying the period of its output pulse signal, said digitally controlled oscillator comprising:

a pulse circulating circuit comprising a plurality of inverting circuits directly electrically connected to each other in a ring shape for circulating a pulse signal therein, one of said inverting circuits comprising a starting inverting circuit for starting a circulation of said pulse signal in said pulse circulating circuit in response to a signal inputted to said starting inverting circuit;

means for changing direct electrical connections between the inverting circuits to be directly electrically connected in said ring shape to include additional inverting circuits in said ring shape or exclude inverting circuits from said ring shape;

means for generating first data representing the number of times of circulation of said pulse signal through said pulse circulating circuit and second data representing the number of said inverting circuits to be directly electrically connected in said ring shape, in the basis of digital data inputted to said generating means, said digital data representing the period of the output pulse signal;

means for controlling said changing means according to said second data generated by said generating means to change direct electrical connections between said inverting circuits directly electrically connected in said ring shape;

means for counting the number of times of circulation of said pulse signal and for generating a detection signal upon the detection of the coincidence of the counted number with the number corresponding to said first data generated by said generating means;

pulse signal generating means for receiving the output signal of a predetermined one of said inverting circuits on the basis of said detection signal from said counting means and for generating an output pulse signal in synchronism with the inversion of said output signal of said predetermined inverting circuit; and means for stopping the action of said starting inverting circuit while said output pulse signal is generated from said pulse signal generating means, and for starting said starting inverting circuit to act when said pulse signal generating means stops to generate said output pulse signal, thereby circulating said pulse signal through said pulse circulating circuit, wherein a frequency of said output pulse signal from said pulse signal generating means is determined by both said first and second data and a frequency of said output signal of said predetermined one of said inverting circuits is determined solely by said second data.

* * * * *